United States Patent [19]

Permuy

[11] Patent Number: 5,781,385
[45] Date of Patent: Jul. 14, 1998

[54] METHOD AND APPARATUS FOR PROTECTING AN ADJUSTABLE IMPEDANCE ELEMENT CONTROLLING THE POWER SUPPLY TO AN ELECTRIC MOTOR, IN PARTICULAR IN A MOTOR VEHICLE

[75] Inventor: Alfred Permuy, Reuil Malmaison, France

[73] Assignee: Valeo Electrique, Creteil, France

[21] Appl. No.: 777,291

[22] Filed: Dec. 27, 1996

[30] Foreign Application Priority Data

Dec. 29, 1995 [FR] France ................... 95 15730

[51] Int. Cl.$^6$ ................................ H02H 5/04
[52] U.S. Cl. .................. 361/30; 361/79; 361/101; 323/277
[58] Field of Search .................. 361/23–33, 79, 361/86–87, 93, 100–101, 103; 323/274–277, 284–285; 318/435–455; 307/9.1, 10.1, 10.6, 10.7, 10.8

[56] References Cited

U.S. PATENT DOCUMENTS

| | | | |
|---|---|---|---|
| 4,979,066 | 12/1990 | Kawata et al. | 361/10 |
| 5,418,676 | 5/1995 | Murakami et al. | 361/23 |
| 5,666,043 | 9/1997 | Henry et al. | 323/277 |

*Primary Examiner*—Jeffrey A. Gaffin
*Assistant Examiner*—Michael J. Sherry
*Attorney, Agent, or Firm*—McCormick, Paulding & Huber

[57] ABSTRACT

A method of protecting an adjustable impedance element such as a transistor controlling the power supplied to an electric motor, in particular in a motor vehicle, wherein the control of said adjustable impedance element is modified when the current passing through it exceeds a given threshold, characterized in that said current threshold is an increasing function of the voltage $U_M$ across the terminals of the motor.

20 Claims, 2 Drawing Sheets

METHOD AND APPARATUS FOR PROTECTING AN ADJUSTABLE IMPEDANCE ELEMENT CONTROLLING THE POWER SUPPLY TO AN ELECTRIC MOTOR, IN PARTICULAR IN A MOTOR VEHICLE

BACKGROUND OF THE INVENTION

The present invention relates to a method and to apparatus for protecting an adjustable impedance element, such as a transistor, controlling the power supply to an electric motor, by limiting the current flowing through said transistor.

The invention has a particularly advantageous application in the field of motor vehicles, in particular for protecting the control of an electric motor for heating, ventilating, or air conditioning the cabin of a motor vehicle, or for an electric motor driving a cooling fan for an internal combustion engine of a motor vehicle.

In FIG. 1, a PRIOR ART diagram, an electric motor M is shown powered by a DC source U, such as the battery of a motor vehicle, together with a MOSFET type transistor 1 connected between said motor M and ground, and controlling the power supply of said motor M.

It is known to protect such a control transistor against high currents in the circuit.

Generally, additional electronics is provided for this purposing seeking to limit the current at a given threshold value.

The current threshold value is the same regardless of the voltage across the terminals of the motor.

However, that kind of protection often turns out to be unsatisfactory.

In particular, on starting, the rotor of the motor is restrained by its high inertia, such that the motor behaves like a resistive load. Consequently, when the transistor becomes conductive, it draws a large amount of current giving rise to heating that can damage the transistor.

For example, for powering at battery voltage (13 volts), and assuming that the motor M behaves like a resistive load having a resistance R of 0.1 ohms, the power that the transistor 1 must be capable of withstanding on starting is 300 W, i.e. twice the maximum power that can normally be withstood by a MOSFET transistor, for example.

Also, in nominal operation, i.e. when the motor is rotating at its nominal speed, the rotor of the motor can be blocked because of the presence of a foreign body in the driven mechanism, thereby giving rise to a rapid increase in current.

Finally, a common fault is constituted by a short circuit in the motor that likewise gives rise to a large amount of current being drawn.

All of the above-described configurations give rise to large amounts of current flowing through the motor-controlling transistor. When the voltage across the drain and source terminals of the transistor is large, the current gives rise to excess power that can damage the transistor.

Unfortunately, said voltage depends on the voltage across the terminals of the motor.

An object of the invention is thus to propose current limitation that enables an adjustable impedance power supply control element, such as a transistor, to be protected effectively against excess power under all situations of motor operation.

SUMMARY OF THE INVENTION

DE-4 115 295 discloses electric motor power supply control in which the current taken by the motor is limited by a current threshold that varies during operation, being lower at the beginning of starting than the current threshold allowed under nominal operating conditions.

According to the technique described in that document, a transistor controlling the power supply of an electric motor is actuated in a sequence of ON and OFF states that impart a mean voltage to said motor proportional to a control voltage $U_{sr}$.

A threshold for regulating the mean current drawn by the motor is determined as a function of the control voltage, said threshold increasing with said control voltage.

When the current reaches its threshold value, the duty ratio of the sequence of transistor ON and OFF states is controlled to bring said current beneath said threshold value. Nevertheless, the above-mentioned threshold value remains constant since the control voltage $U_{sr}$ remains, a priori, unchanged. Consequently, the current remains in the vicinity of said threshold value.

As a result, if the voltage across the terminals of the motor becomes very low, the voltage across the terminals of the MOSFET transistor can be such that the excess power damages it. Further, with the control circuit of DE-4 115 295, it is necessary to provide additional means for detecting motor short circuit and for instantaneously switching off the power supply thereto, and also timing means and means for restarting the motor progressively after a determined off duration.

The invention seeks to protect an element of adjustable impedance (as opposed to an on/off switch as in DE-4 115 265) by controlling it in such a manner that as soon as high current is observed, said current is caused to be decreased to a low value. The control element is thus protected effectively, and this is done by means of a circuit that is very simple.

The solution of the invention consists causing the current limitation threshold to be an increasing function of the voltage across the terminals of the motor.

It is known that the voltage $U_M$ across the terminals of the motor satisfies the following equation:

$$U_M = K\Omega + RI$$

where $\Omega$ is the angular velocity of the motor, I is the current drawn by the motor, R is its resistance, and K is a parameter of the motor.

Using the solution proposed by the invention, when the current exceeds its threshold value, the control lowers the value of said current and consequently the value of $U_M$ and the threshold current.

As a result, in the event of the motor being blocked, the current drawn by the motor decreases rapidly until it reaches an equilibrium point where the motor is no longer rotating. In the event of a short circuit, the current takes on the threshold value allowed for a motor voltage of zero.

In both cases, the current imposed in this way is low compared with the nominal operating current.

Advantageously, the characteristics of threshold current as a function of motor voltage are selected so that the threshold current authorized for zero voltage across the terminals of the motor is sufficient to allow the said motor to start.

Thus, particularly when the motor current and voltage are taken to the motor equilibrium point by the motor being blocked, the motor can restart immediately after the blocking torque disappears.

Other characteristics and advantages of the invention appear further from the following description. The descrip-

3 tion is purely illustrative and non-limiting. It should be read with reference to the accompanying drawings, in which:

IN THE DRAWINGS

DESCRIPTION OF PREFERRED EMBODIMENTS

Figure 1:
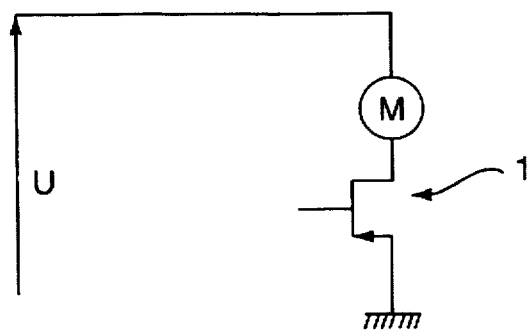
FIG. 1 is a PRIOR ART circuit diagram for powering an electric motor with DC.
Figure 2:
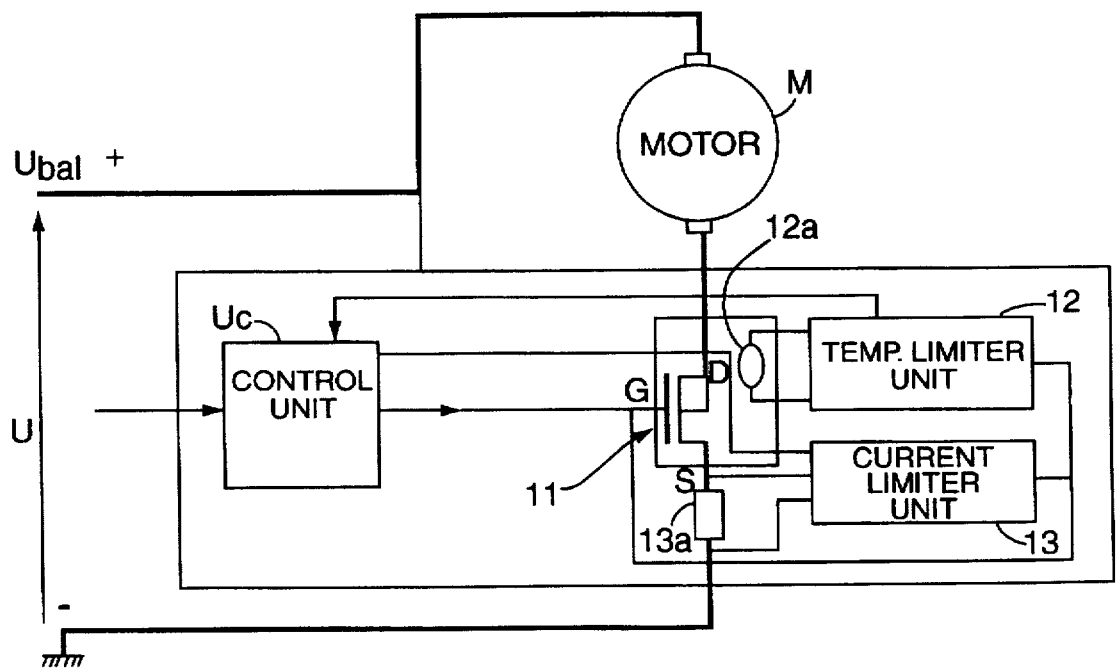
FIG. 2 is a diagram of a power supply circuit similar to that of FIG. 1, further including a current limiter device constituting one possible embodiment of the invention.

The power supply circuit shown in FIG. 2 comprises an electric motor M powered by a DC source U, together with a MOSFET type transistor 11 which constitutes an adjustable impedance element controlling the power supplied to said motor M.

By way of example, the motor M is a motor for heating, ventilating, or air conditioning a motor vehicle cabin.

The source S of the transistor 11 is connected to ground while its drain D is connected to one of the terminals of the motor M.

The grid G of the transistor 11 is voltage controlled by a control unit $U_C$ which, in normal operation, controls the current passing through the motor by adjusting the impedance of said transistor.

In the event of the motor M being a fan motor, the control unit $U_C$ is implemented, for example, by the microprocessor for controlling vehicle air conditioning.

In a variant, the control unit may naturally comprise an application specific integrated circuit (ASIC).

The control unit $U_C$ receives information concerning the control to be applied to the motor M from controls inside the vehicle.

For voltage control, the control unit $U_C$ includes means (not shown) for setting the voltage $U_M$ across the terminals of the motor M as a function of the speed of rotation desired for the motor.

If current control is used, then the control unit $U_C$ applies a voltage to the grid G of the transistor 11 to define the current I passing through the transistor 11, and thus through the motor M.

The invention is equally applicable to each of those two forms of control.

The circuit also includes a unit 12 for limiting the temperature of the transistor 11, and a unit 13 for limiting current.

The unit 12 is not particularly described herein. It has a temperature probe 12a situated close to the transistor 11 from which it receives temperature information and, as a function of said temperature information, it modifies the grid voltage applied to the transistor 11 by the control unit $U_C$.

The unit 13 is connected to means 13a for measuring the current passing through said transistor 11. These means 13a are constituted by a current-sensing resistor 13a in series with the motor M and the transistor 11. The voltage across the terminals of said resistor 13a is proportional to the current I flowing through the transistor 11 and is input to the current limiter unit 13.

4

Means for measuring the voltage $U_M$ are also provided. For example, the voltage of the connection between the motor M and the drain of the transistor 11 is also input to the unit 13.

The unit 13 includes means for comparing said current with threshold values as a function of the voltage $U_M$ of the motor M, and for modifying the voltage applied to the grid G of the transistor 11 by the control unit $U_C$ so as to keep said current below said threshold values.

The threshold current values are an increasing function of the voltage $U_M$. In particular, the maximum current $I_O$ acceptable on starting is much less than the maximum current $I_{Nmax}$ under nominal operating conditions, such that the power that the transistor 11 needs to withstand on starting is very low.

The starting current $I_O$ is nevertheless sufficient to enable the motor to start. By way of example, it is about 2.5 amps.

Figure 3:
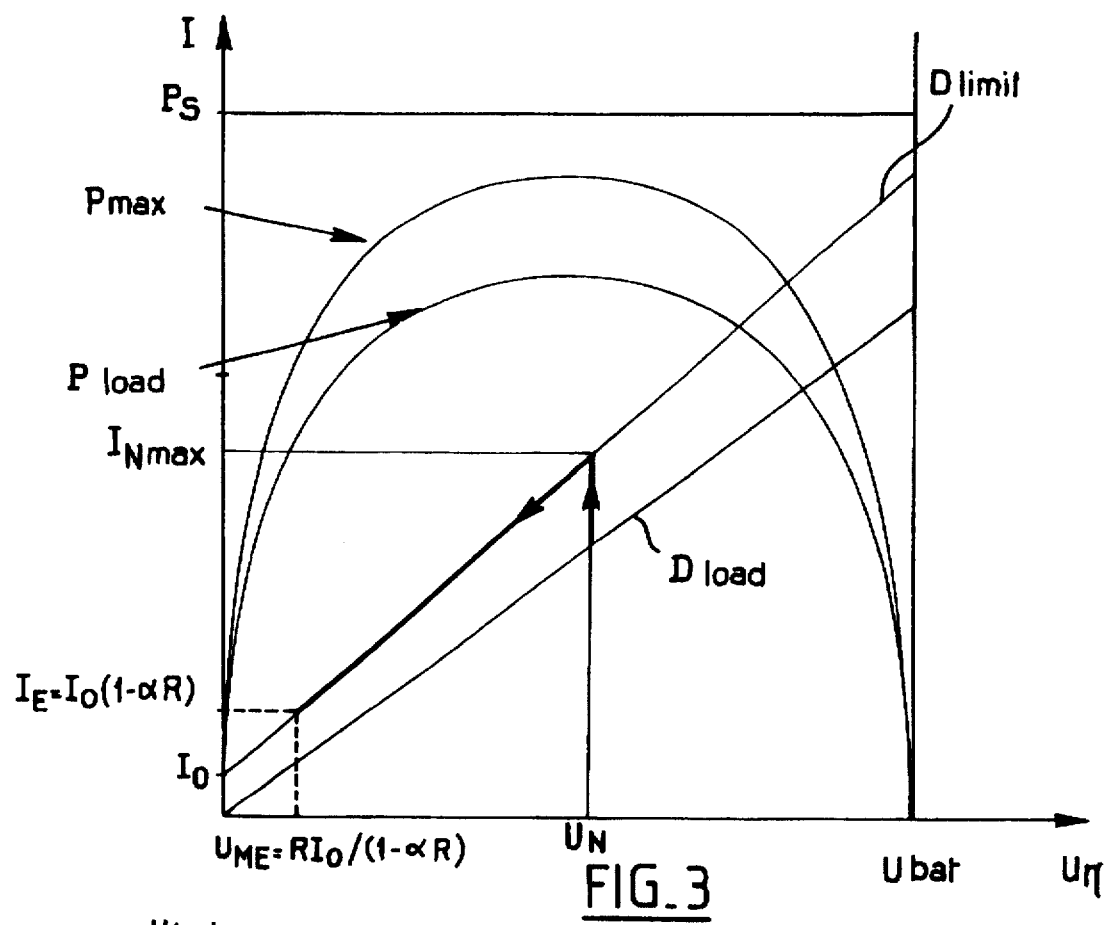
FIG. 3 is a curve of current limiting in accordance with the invention.

The current limiter unit 13 is constituted, for example, by an analog circuit which sets a threshold value on the current I passing through the transistor 11, which value is a linear function of the voltage $U_M$ of the motor M, as shown in FIG. 3 (line $D_{limit}$).

In nominal operation, the voltage $U_M$ across the terminals of the motor varies between 0 and $U_{bat}$ where $U_{bat}$ is the battery voltage, as a function of the speed desired for the motor.

The description relates to the case where the motor is voltage-controlled.

An implementation of current limitation is represented on FIG. 3 by the arrows marked thereon.

It is assumed that the motor is initially rotating at its nominal speed such that the voltage $U_M$ across its terminals is equal to a determined value $U_M$ between 0 and $U_{bar}$. The current taken by the motor M then has a value lying between that of the current set by the load line ($D_{load}$) for said voltage $U_N$ and a threshold value $IN_{max}$.

If the rotor of motor M is braked, then the e.m.f. developed by said motor M drops, such that the current increases.

When the current reaches the threshold value $I_{Nmax}$ corresponding to said nominal voltage $U_N$, i.e. when it reaches the line $D_{limit}$, the unit 13 controls the transistor 11 so as to reduce the current.

This results in a decrease in the speed of the motor M and thus in a decrease in the voltage $U_M$, thereby also decreasing the threshold value for the current.

Consequently, the unit 13 will control the transistor 11 so that the voltage $U_M$ and the current I through the motor M decrease simultaneously by moving along the line $D_{limit}$ until an equilibrium point is reached such that:

$$I=\alpha U_M + I_O$$

and $$U_M = RI$$

where $\alpha$ is the slope of the line $D_{limit}$ and R is the resistance of the motor on starting.

This equilibrium point thus corresponds to:

$$I_E = I_O/(1-\alpha R)$$

$$U_M = RI_O/(1-\alpha R)$$

Consequently, when the motor M is blocked, the unit 13 limits the current passing through it to $I_O/(1-\alpha R)$, which has a value that is much less than the value $I_{Nmax}$ that can be reached under nominal conditions.

For example, with the values given above for R and I and with α equal to about 6 A/V, the current $I_E$ taken by the rotor when blocked is about 6 A, whereas the maximum current $I_{max}$ for $U_M=U_{bat}$ is about 80 A.

When the breaking torque is released, the voltage $U_M$ increases again up to the nominal operating voltage $U_N$.

It will also be observed that, when the motor M is short circuited, the current limiting curve shown in FIG. 3 can be used to limit the current to a value well below $I_{max}$. Since the voltage $U_M$ is then zero, the current is then limited to $I_O$.

FIG. 3 also shows the maximum power $P_{max}$ that the transistor 11 needs to be able to withstand in association with the linear current limiting illustrated by this figure. By way of indication, FIG. 3 also shows $P_{load}$ that the transistor 11 accepts when the load on the motor M corresponds to normal operation.

Whatever the voltage $U_M$ of the motor, the power $P_{max}$ is less than the threshold power $P_S$ above which the transistor 11 is damaged.

Under short circuit conditions, i.e. when the voltage across the terminals of the motor is zero, the power $P_{max}$ is $U_{bat} \times I_O$, i.e. about 30 W.

When the motor is blocked, its current is limited to $I_E$ and the power passing through the MOS transistor is:

$$(U_{bat}-RI_E) \times I_E$$

i.e. about 50 W.

Consequently, in both cases, the maximum power $P_{max}$ that the transistor 11 needs to withstand is greatly limited.

Figure 4:
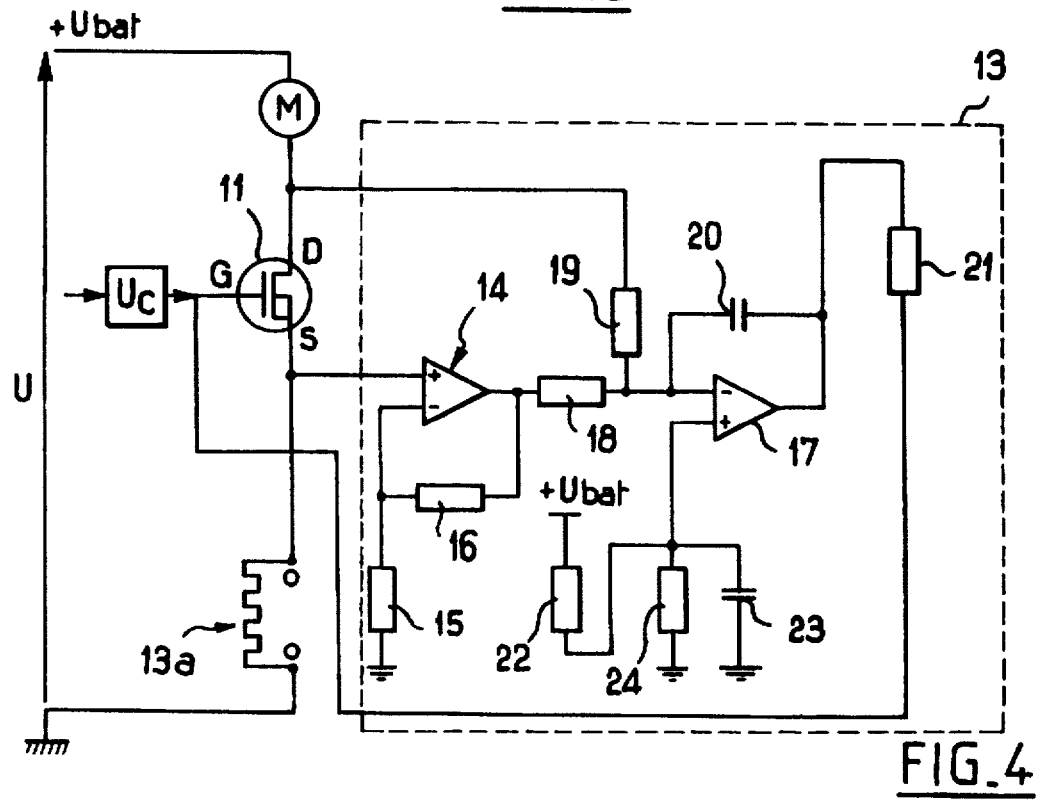
FIG. 4 is a circuit diagram showing a possible embodiment of an analog circuit for current limiting in application of the invention.

Reference is now made to FIG. 4 showing an example of the analog circuit 13 for performing linear current limiting of the type described above.

The circuit comprises an operational amplifier 14 whose non-inverting input is connected to the source of the transistor 11 and whose inverting input is connected to ground via a 12 kohm resistor 15, etc.

A 100 kohm resistor 16 is connected to provide negative feedback from the output of the amplifier 14 to its inverting input.

The source S of the transistor 11 is connected to ground via the current-sensing resistor 13a for measuring the current I passing through the motor.

Thus, the operational amplifier 14 acts as an amplifier of the voltage across the terminals of the current-sensing resistor 13a.

The output from the operational amplifier 14 is connected to the inverting input of an operational amplifier 17 via a 27 kohm resistor 18.

This inverting input is also connected via a 270 kohm resistor 19 to the drain of transistor 11.

A 47 nF capacitor 20 is connected between the output of amplifier 17 and its inverting input.

The output of amplifier 17 is also connected via a 220 kohm resistor 21 to the grid of transistor 11.

The non-inverting output of operational amplifier 17 also receives a reference voltage which is delivered thereto by the battery voltage to which it is connected via a 240 kohm resistor 22. This non-inverting input is also connected to ground via a capacitor 23 having a capacitance of 22 nF, connected in parallel with a 27 kohm resistor 24.

The resistors 22 and 24 are connected as a divider bridge to deliver a constant voltage representative of $I_O$. The capacitor 23 is a decoupling capacitor.

The sub-circuit comprising the amplifier 14 and the resistors 15 to 19 also serves to provide a linear combination of the voltage across the terminals of the current-sensing resistor 13a and the voltage across the terminals of the motor.

The voltage injected to the inverting input of amplifier 17 is representative of the quantity $I-\alpha U_M$ and it is compared by the sub-circuit constituted by the amplifier 17 and components 20 to 24 with a voltage representative of $I_O$.

When $I-\alpha U_M$ becomes greater than $I_O$, i.e. when the current I exceeds $I_O+\alpha U_M$, the output voltage from the amplifier 17 modifies the voltage applied to the grid G of the transistor 11 so as to reduce the current I.

The invention is described above for the case where current is limited in linear manner, which is the simplest case to implement by means of an analog circuit.

Naturally, other types of limit function can be envisaged.

In particular, when the limiter unit 13 is a digital processor unit, as is the case for example if the limit function is implemented together with the control function of the unit $U_C$, in a single microprocessor, it is possible for the curve of current limitation as a function of voltage $U_M$ to be of arbitrary form, and it is then advantageously selected so as to optimize as well as possible power dissipation in the transistor 11.

I claim:

1. In a motor vehicle, a method of protecting an adjustable impedance element (11) controlling the power supply of an electric motor (M), the impedance element having a variable current threshold which is an increasing function of the voltage (Um) across the terminals of a motor (M), in which the control of said adjustable impedance element (11) is modified when the current passing through it exceeds the given threshold.

2. A method according to claim 1, characterized in that the current threshold authorized for zero voltage across the terminals of the motor (M) is sufficient to enable it to start.

3. A method according to claim 1, characterized in that the threshold current is a linear function of the voltage across the terminals of the motor (M).

4. A method according to claim 1, characterized in that the adjustable impedance element (11) is a MOSFET type transistor.

5. Apparatus for protecting an adjustable impedance element (11) controlling the power supply to an electric motor (M), in particular in a motor vehicle, the apparatus comprising means (13a) for measuring the current passing through said adjustable impedance element (11) and a current limiter unit ($U_C$, 13) connected to said current measurement means (13) and controlling said adjustable impedance element (11) in such a manner as to reduce said current when the current exceeds a given threshold, characterized in that said current limiter unit includes means for varying the current threshold with increasing voltage across the terminals of the motor (M).

6. Apparatus according to claim 5, characterized in that the measurement means include a current-sensing resistor (13a) connected in series with the motor (M) and the adjustable impedance element (11), the voltage across the terminals of said resistor (13a) being applied to an input of the current limiter unit (13).

7. Apparatus according to claim 5, characterized in that the current threshold authorized for zero voltage across the terminals of the motor (M) is sufficient to enable the motor to start.

8. A device according to claim 5, characterized in that the current limiter unit (13) is an analog unit, the threshold current being a linear function of the voltage across the terminals of the motor (M).

9. Apparatus according to claim 5, characterized in that the current limiter unit (13) is a digital processor unit.

10. Apparatus according to claim 5, characterized in that the adjustable impedance element (11) is a MOSFET type transistor.

11. Apparatus according to claim 6, characterized in that the current threshold authorized for zero voltage across the terminals of the motor (M) is sufficient to enable the motor to start.

12. Apparatus according to claim 6, characterized in that the current limiter unit (13) is an analog unit, the threshold current being a linear function of the voltage across the terminals of the motor (M).

13. Apparatus according to claim 7, characterized in that the current limiter unit (13) is an analog unit, the threshold current being a linear function of the voltage across the terminals of the motor (M).

14. Apparatus according to claim 6, characterized in that the current limiter unit (13) is a digital processor unit.

15. Apparatus according to claim 7, characterized in that the current limiter unit (13) is a digital processor unit.

16. Apparatus according to claim 8, characterized in that the current limiter unit (13) is a digital processor unit.

17. Apparatus according to claim 6, characterized in that the adjustable impedance element (11) is a MOSFET type transistor.

18. Apparatus according to claim 7, characterized in that the adjustable impedance element (11) is a MOSFET type transistor.

19. Apparatus according to claim 8, characterized in that the adjustable impedance element (11) is a MOSFET type transistor.

20. Apparatus according to claim 9, characterized in that the adjustable impedance element (11) is a MOSFET type transistor.

* * * * *

UNITED STATES PATENT AND TRADEMARK OFFICE
CERTIFICATE OF CORRECTION

PATENT NO.   : 5,781,385
DATED        : July 14, 1998
INVENTOR(S)  : Alfred Permuy It is certified that error appears in the above-identified patent and that said Letters Patent is hereby corrected as shown below:

On the title page, item [73], "Electrique" should read --Electronique--.

Signed and Sealed this

Sixteenth Day of March, 1999

Attest:

Q. TODD DICKINSON

Attesting Officer

Acting Commissioner of Patents and Trademarks